United States Patent
Clark et al.

(10) Patent No.: US 11,569,763 B2
(45) Date of Patent: Jan. 31, 2023

(54) SYSTEM AND METHOD FOR ADDRESSING FAILURE-TO-START CONDITION IN ELECTRIC MOTOR WITH INTERNAL MAGNETS

(71) Applicant: Nidec Motor Corporation, St. Louis, MO (US)

(72) Inventors: Bret S. Clark, Oakville, MO (US); Christopher D. Schock, Lake Saint Louis, MO (US); Prakash B. Shahi, St. Louis, MO (US)

(73) Assignee: Nidec Motor Corporation, St. Louis, MO (US)

( * ) Notice: Subject to any disclaimer, the term of this patent is extended or adjusted under 35 U.S.C. 154(b) by 145 days.

(21) Appl. No.: 17/107,479

(22) Filed: Nov. 30, 2020

(65) Prior Publication Data
US 2022/0173672 A1    Jun. 2, 2022

(51) Int. Cl.
| | | |
|---|---|---|
| *H02P 1/46* | (2006.01) |
| *H02P 21/18* | (2016.01) |
| *H02K 1/27* | (2022.01) |
| *H02P 1/02* | (2006.01) |
| *G01R 31/34* | (2020.01) |
| *H02K 1/2706* | (2022.01) |

(52) U.S. Cl.
CPC ............ *H02P 1/029* (2013.01); *G01R 31/343* (2013.01); *H02K 1/2706* (2013.01)

(58) Field of Classification Search
CPC .. H02P 6/20; H02P 21/34; H02P 21/18; H02P 1/46; H02K 1/27
See application file for complete search history.

(56) References Cited

U.S. PATENT DOCUMENTS

| | | | | |
|---|---|---|---|---|
| 5,047,699 A | * | 9/1991 | Rozman | F02N 11/04 318/431 |
| 9,473,059 B2 | * | 10/2016 | Omata | B60L 50/40 |
| 2002/0117990 A1 | * | 8/2002 | Sawada | B60L 15/025 318/727 |
| 2005/0218864 A1 | * | 10/2005 | Eguchi | H02P 21/22 318/807 |

(Continued)

FOREIGN PATENT DOCUMENTS

| | | | | |
|---|---|---|---|---|
| JP | 2019017179 A | * | 1/2019 | |
| WO | WO-2013016505 A2 | * | 1/2013 | ............... H02P 1/46 |

*Primary Examiner* — Thai T Dinh
(74) *Attorney, Agent, or Firm* — Hovey Williams LLP (57) ABSTRACT

A system and method for identifying and responding to a condition in which an electric motor fails to start. A rotor core includes slots in which magnets are received to produce an electrical reluctance. A motor controller determines a position of the rotor, uses the determined position to convert a torque demand to a demanded D-axis current value, and compares the demanded value to a supplied D-axis current value. If the demanded value differs from the supplied value by at least a pre-established threshold amount, then the motor is restarted. Otherwise, the difference between the torque demand and an actual current is used to drive a voltage applied to the motor. The controller may also implement a sensorless technology, and may restart the motor if the demanded value differs from the supplied value by at least the threshold amount even if the sensorless technology determines that the motor started.

18 Claims, 5 Drawing Sheets

(56) References Cited

U.S. PATENT DOCUMENTS

2013/0214713 A1* 8/2013 Omata .................... H02P 21/22
  318/400.02
2014/0354197 A1* 12/2014 Ito ............................. H02P 3/18
  318/366

* cited by examiner

SYSTEM AND METHOD FOR ADDRESSING FAILURE-TO-START CONDITION IN ELECTRIC MOTOR WITH INTERNAL MAGNETS

FIELD

The present invention relates to systems and methods for controlling electric motors, and more particularly, embodiments concern a system and method for addressing, i.e., identifying and responding to, a condition in which an electric motor with internal magnets fails to start.

BACKGROUND

The sensorless technology used in a heating, ventilation, air condition, and refrigeration (HVACR) variable speed electric motor starts the motor from rest in an open loop mode. In this mode, the motor controller applies a specified voltage/frequency profile to initiate motion. Once the motor achieves a pre-established speed, the sensorless technology attempts to find the actual speed and angle of the motor. If successful, the motor can then run in a closed loop sensorless mode in which it is capable of full torque, speed, and efficiency of operation. In some circumstances, the motor may be prevented during the open loop portion of the starting cycle from reaching the speed needed for the sensorless technology to close the loop. This may be referred to as a "locked rotor" condition when the rotor does not move or does not achieve the required speed but is not mechanically locked or otherwise physically prevented from moving or achieving the required speed. When such a failure-to-start condition occurs, the motor should be stopped and the open loop start sequence repeated for correct operation. However, detecting this condition is difficult because limited information is available during the open loop starting process.

One solution is to observe parameters of the sensorless calculations and watch for them to stabilize at steady state values. Once this occurs, it normally indicates that the sensorless technology is ready to switch to the closed loop mode. However, occasionally this solution does not work correctly and falsely indicates that the motor has successfully started when, in fact, it has not. When this happens, the motor will continue to operate but will not be able to generate the full torque and speed or reach the full efficiency of operation This background discussion is intended to provide information related to the present invention which is not necessarily prior art.

SUMMARY

Embodiments address the above-described and other problems by providing a system and method for better addressing, i.e., identifying and responding to, an abnormal start condition in which an electric motor with internal magnets fails to start. Embodiments provide a practical solution to this particular problem (i.e., identifying and responding to a failure-to-start condition) involving a particular machine (i.e., an electric motor with internal magnets) in a particular field (i.e., controlling electric motors).

In a first embodiment of the present invention, an electric motor system may comprise an electric motor and a motor controller. The electric motor may include a stator and a rotor, the rotor including a core and one or more permanent magnets positioned at least partially inside the core so as to produce an electrical reluctance when the rotor is moving relative to the stator. The motor controller may be in electronic communication with the electric motor and configured to detect an abnormal start condition by comparing a demanded direct axis (or D-axis) current value to a supplied D-axis current value, and restart the electric motor if the demanded D-axis current value differs from the supplied D-axis current value by at least a pre-established threshold amount.

In a second embodiment of the present invention, an electric motor system may comprise an electric motor and a motor controller. The electric motor may include a stator and a rotor, and the rotor including a core and one or more permanent magnets positioned at least partially inside the core so as to produce an electrical reluctance when the rotor is moving relative to the stator. The motor controller may be in electronic communication with the electric motor and configured to detect an abnormal start condition by comparing a demanded quadrature axis (or Q-axis) current value to a supplied Q-axis current value, and restart the electric motor if the demanded Q-axis current value differs from the supplied Q-axis current value by at least a pre-established threshold amount.

Various implementations of the first and second embodiments may include any one or more of the following additional features. The electric motor may be a three-phase electric motor producing between one-quarter and five horsepower. The core may include one or more slots, and each permanent magnet of the one or more permanent magnets may be received in a respective slot of the one or more slots. For D-axis current, the pre-established threshold amount may be between ten percent and forty percent, or between twenty percent and thirty percent; and for Q-axis current, the pre-established threshold amount may be between two percent and twelve percent, or between four percent and ten percent. The motor controller may be further configured to implement a sensorless technology for determining whether the electric motor has started. The motor controller may restart the electric motor if the demanded D-axis or Q-axis current value differs from the supplied D-axis or Q-axis current value by at least the pre-established threshold amount even if the sensorless technology determines that the electric motor has started. The motor controller may be further configured to determine a position of the rotor; use the determined position of the rotor to convert a torque demand on the electric motor to the demanded D-axis or Q-axis current value; and if the demanded D-axis or Q-axis current value does not differ from the supplied D-axis or Q-axis current value by at least the pre-established threshold amount, then use a difference between a torque demand and an actual current to drive a voltage applied to the electric motor.

In a third embodiment of the present invention, a method of controlling the operation of an electric motor system may comprise the following steps. The electric motor system may include an electric motor, including a stator and a rotor, and the rotor including one or more permanent magnets positioned at least partially inside the core so as to produce an electrical reluctance when the rotor is moving relative to the stator, and a motor controller in electronic communication with the electric motor. An attempt may be made to start the electric motor, and a position of a rotor may be determined. The determined position of the rotor may be used to convert a torque demand on the electric motor to the demanded D-axis or Q-axis current value. The demanded D-axis or Q-axis current value may be compared to a supplied D-axis or Q-axis current value, and the electric motor may be restarted if the demanded D-axis or Q-axis current value differs from the supplied D-axis or Q-axis current value by at least a pre-established threshold amount.

Various implementations of the second embodiment may include any one or more of the following additional features. The electric motor may be a three-phase electric motor producing between one-quarter and five horsepower. The core may include one or more slots, and each permanent magnet of the one or more permanent magnets may be received in a respective slot of the one or more slots. For D-axis current, the pre-established threshold amount may be between ten percent and forty percent, or between twenty percent and thirty percent, while for Q-axis current, the pre-established threshold amount may be between two percent and twelve percent, or between four percent and ten percent. The method may further include implementing a sensorless technology for determining whether the electric motor has started. The method may further include restarting the electric motor if the demanded D-axis or Q-axis current value differs from the supplied D-axis or Q-axis current value by at least the pre-established threshold amount even if the sensorless technology determines that the electric motor has started. The method may further include determining a position of the rotor; using the determined position of the rotor to convert a torque demand on the electric motor to the demanded D-axis or Q-axis current value; and if the demanded D-axis or Q-axis current value does not differ from the supplied D-axis or Q-axis current value by at least the pre-established threshold amount, then using a difference between a torque demand and an actual current to drive a voltage applied to the electric motor.

This summary is not intended to identify essential features of the present invention, and is not intended to be used to limit the scope of the claims. These and other aspects of the present invention are described below in greater detail.

DRAWINGS

Embodiments of the present invention are described in detail below with reference to the attached drawing figures, wherein.

The figures are not intended to limit the present invention to the specific embodiments they depict. Other than the flowchart and graphs, the drawings are to scale with respect to the relationships between the components of the illustrated structures, even though the drawings do not provide exact dimensions or tolerances.

DETAILED DESCRIPTION

The following detailed description of embodiments of the invention references the accompanying figures. The embodiments are intended to describe aspects of the invention in sufficient detail to enable those with ordinary skill in the art to practice the invention. Other embodiments may be utilized and changes may be made without departing from the scope of the claims. The following description is, therefore, not limiting. The scope of the present invention is defined only by the appended claims, along with the full scope of equivalents to which such claims are entitled.

In this description, references to "one embodiment," "an embodiment," or "embodiments" mean that the feature or features referred to are included in at least one embodiment of the invention. Separate references to "one embodiment," "an embodiment," or "embodiments" in this description do not necessarily refer to the same embodiment and are not mutually exclusive unless so stated. Specifically, a feature, component, action, step, etc. described in one embodiment may also be included in other embodiments, but is not necessarily included. Thus, particular implementations of the present invention can include a variety of combinations and/or integrations of the embodiments described herein.

Broadly characterized, embodiments provide a system and method for better addressing, i.e., identifying and responding to, an abnormal start condition in which an electric motor with internal magnets fails to start. Embodiments provide an independent solution (independent of, e.g., sensorless or other technologies) for determining whether the motor has started based on a comparison of demanded D-axis current (iD) and supplied or actual D-axis current (sD). Embodiments may be more effective with certain motors and/or under certain circumstances than the sensorless technology, and may correctly identify failures to start which the sensorless technology would not. Embodiments may be used independent of the sensorless and/or other technologies, or may be used in conjunction with the sensorless and/or other technologies to provide redundant function. In one implementation, if the current solution identifies that the motor has not started, regardless of whether another technology (e.g., sensorless) is used and has determined that the motor has started, the motor controller may respond by restarting the motor. In one implementation, if multiple technologies are used and any one technology, regardless of which one, determines that the motor has not started, then the motor controller may respond by restarting the motor. Combining the present solution with one or more other technologies may provide a more robust system and method for identifying a failure-to-start condition. Thus, because sensorless technology may incorrectly determine that the motor has started when, in fact, it has not, and thereby create a particular problem, embodiments of the present invention provide a practical solution to this particular problem (i.e., identifying and responding to a failure-to-start condition) involving a particular machine (i.e., an electric motor with internal magnets) in a particular field (i.e., controlling electric motors).

Embodiments may use signals from a current controller component of the motor controller to determine whether the sensorless technology has successfully closed the loop. In the current controller the torque demand on the motor is converted to a direct current (DC) level of D-axis current and Q-axis current. In an induction motor, the D-axis is the flux-producing axis of the field winding in the direction of the DC field, and the Q-axis is the torque-producing axis of the field winding and leads the D-axis by ninety degrees. In a permanent magnet motor such as is used in embodiments and implementations of the present invention, the D-axis is the flux-producing axis in the field winding in the direction of the DC field, and can also produce reluctance torque. These currents are then compared against the actual currents in the motor. The difference between the demand current and the actual current is used to drive the voltage applied to the motor. If the system is operating normally, the actual D- and Q-axis currents will be DC levels that change with the demands on the system. The calculations of the actual D- and Q-axis currents may involve the rotor position generated by the sensorless technology.

Embodiments determine how much the actual D-axis (and/or Q-axis) current is varying. A large variation in the actual D-axis current level indicates that the rotor position is not known correctly which means the motor should be stopped and the open loop start process should be attempted again. In order to generate a signal that works well over a variety of loading situations, the variation in the actual D-axis current is measured and then divided by the demand D-axis current to produce a percentage of variation value. The percentage of variation allows a threshold to be determined that works well for both lightly and heavily loaded conditions for which the D-axis current level may be significantly different.

Referring to FIGS. 1-5, embodiments of a system 10 and a method 110 are shown for addressing, i.e., identifying and responding to, a condition in which an electric motor with internal magnets fails to start. An embodiment of such an electric motor system 10 may comprise an electric motor 12 including a stator 14, a rotor 16, and a motor controller 18, and the method 110 may be implemented by and reflect the functioning of the system 10. The electric motor 12 may be substantially any suitable electric motor, such as a three-phase alternating current (AC) electric motor producing between one-quarter and five horsepower, and may be used in, e.g., HVACR applications. The stator 14 may incorporate substantially any suitable technology, including conventional stator technologies.

Figure 1:
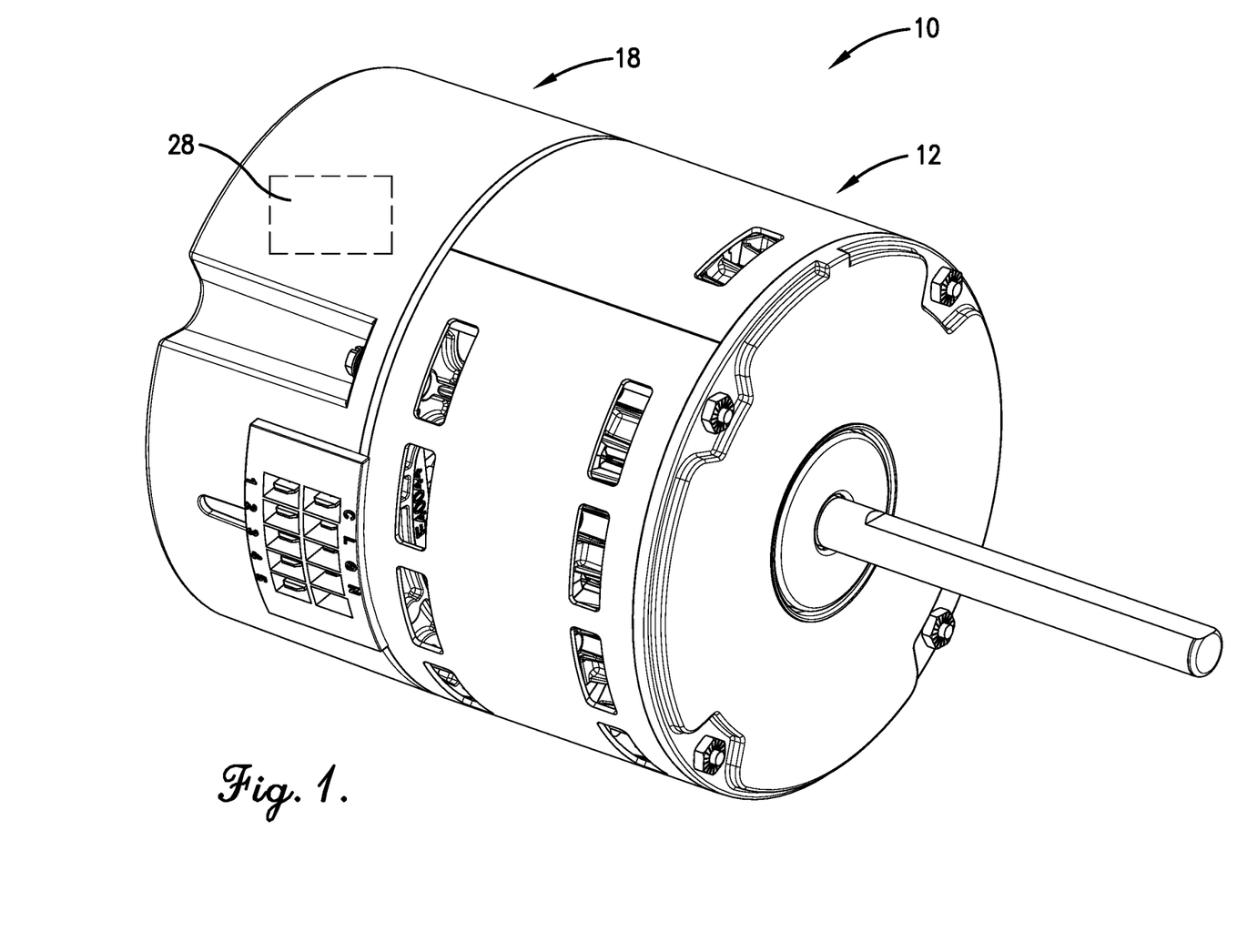
FIG. 1 is a perspective view of an electric motor system incorporating an embodiment of the present invention for identifying and responding to an abnormal start condition in which an electric motor fails to start.
Figure 2:
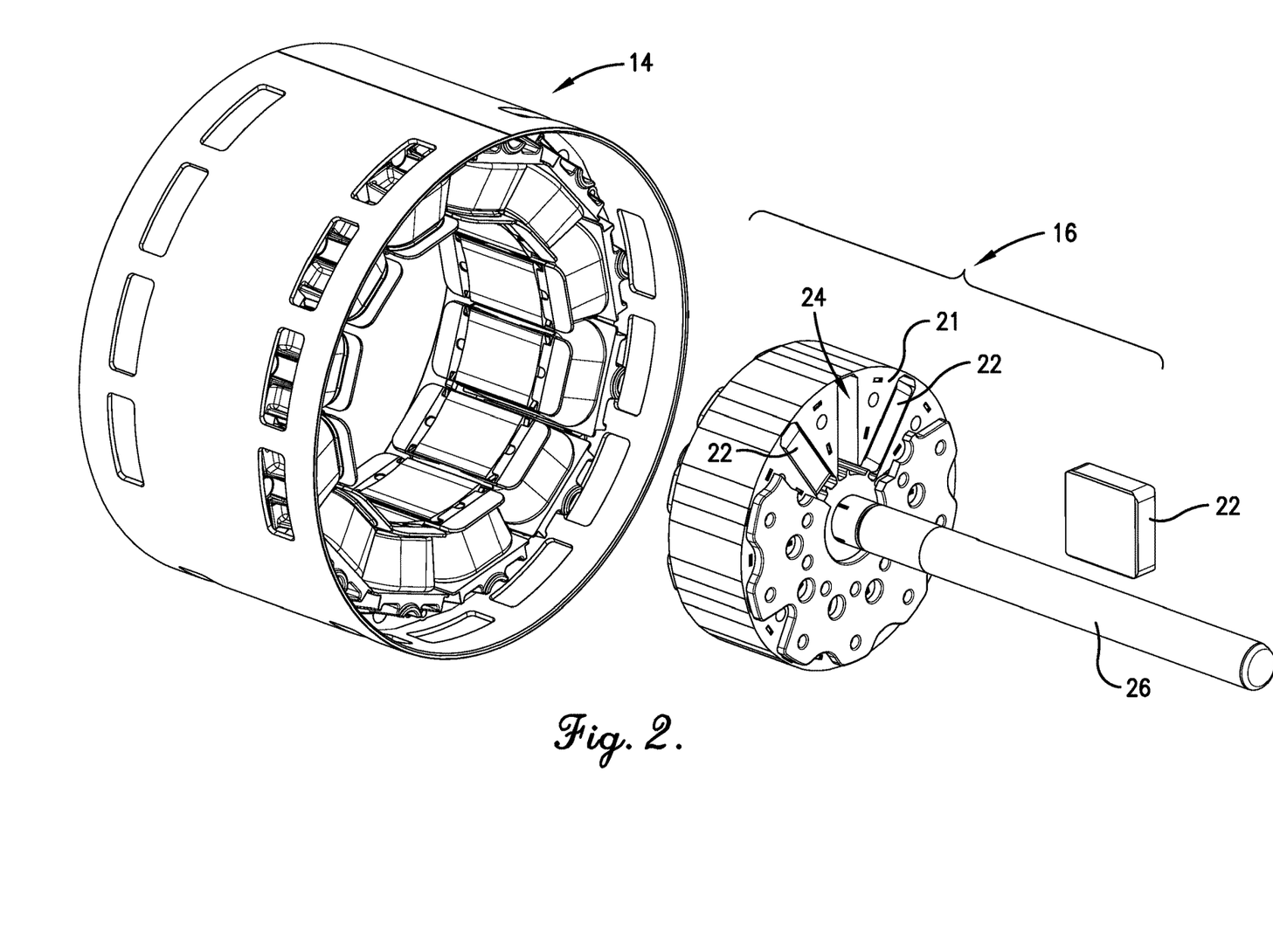
FIG. 2 is an exploded perspective view of stator and rotor components of the electric motor of FIG. 1, wherein the rotor has internal permanent magnets.

The rotor 16 may include a core 21 and one or more permanent magnets 22 positioned at least partially inside the core 21 so as to produce an electrical reluctance when the rotor 16 is moving relative to the stator 14. In one implementation, the rotor core 21 may include a plurality of slots or recesses 24 which each receive a respective permanent magnet of a plurality of the permanent magnets 22 and which maintain the permanent magnets at least partially inside the rotor core 21. It will be understood that a three-phase AC motor with permanent magnets mounted on the surface of the rotor provides no reluctance torque, while the same motor with internal magnets provides both reluctance and magnetic torque. As used herein, the term "internal magnets" refers to one or more permanent magnets positioned at least partially inside, or not wholly on the surface of, a rotor core so as to produce an electrical reluctance when the rotor is moving relative to a stator component. The rotor 16 may be connected to or otherwise physically drive a shaft 26 which may drive substantially any suitable load (e.g., a blower).

Figure 5:
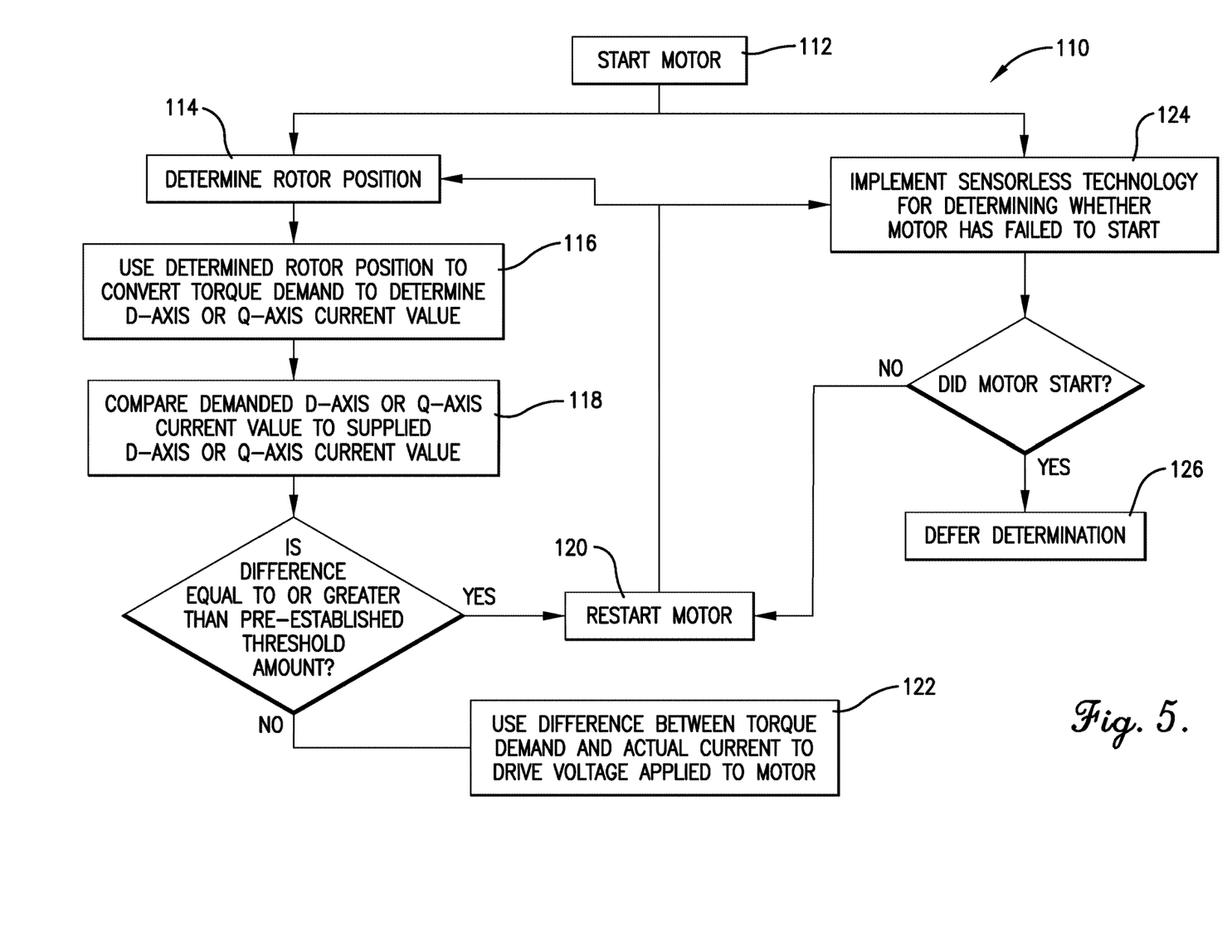
FIG. 5 is a flowchart of steps performed by the system of FIG. 1 for identifying and responding to a condition in which the electric motor fails to start.

The motor controller 18 may include an electronic processing element 28, may be in wired or wireless electronic communication with the electric motor 12, and may be configured to determine a position of the rotor 16, as shown in step 114 of FIG. 5, and then use the determined position of the rotor 16 to convert a torque demand on the electric motor 12 to the demanded D-axis current value, as shown in step 116. The motor controller 18 may detect an abnormal start condition by comparing the demanded D-axis current value 30 to a supplied or actual D-axis current value 32, as shown in step 118, and restart the electric motor 12 if the demanded D-axis current value differs from the supplied D-axis current value by at least a pre-established threshold amount, as shown in step 120. In various implementations, the motor controller 18 may additionally or alternatively detect the abnormal start condition by comparing a demanded Q-axis current value 40 to a supplied or actual Q-axis current value 42, and restart the electric motor 12 if the demanded Q-axis current value differs from the supplied Q-axis current value by at least a pre-established threshold amount (e.g., between two and twelve percent, or between four and ten percent). In one implementation, the supplied D-axis and/or Q-axis current relates to a, respectively, D-axis and/or Q-axis current estimation based on a measured DC link current.

In various implementations, the pre-established threshold amount may be based on a percentage of the demanded D-axis current value, and may be, for example, approximately between ten percent and forty percent, or approximately between twenty percent and thirty percent. In one implementation, the motor controller 18 may be further configured so that if the demanded D-axis current value does not differ from the supplied D-axis current value by at least the pre-established threshold amount, then a difference between a torque demand and an actual current may be used to drive a voltage applied to the electric motor 12, as shown in step 122.

In one implementation, the motor controller 18 may be further configured to also implement a sensorless technology for determining whether the electric motor 12 has started, as shown in step 124. The motor controller 18 may restart the electric motor 12 if the sensorless technology determines that the electric motor 12 failed to start, as shown in step 120. If the sensorless technology determines that the electric motor 12 started successfully, the motor controller 18 may defer the ultimate determination of whether the electric motor 12 has started to the present solution, as shown in step 126—i.e., if the demanded D-axis current value differs from the supplied D-axis current value by at least the pre-established threshold amount, then the motor controller 18 may restart the electric motor 12 even if the sensorless technology determines that the electric motor 18 successfully started.

The system 10 may include more, fewer, or alternative components and/or perform more, fewer, or alternative actions, including those discussed elsewhere herein, and particularly those discussed in the following section describing the method 110.

Referring again to FIG. 5, an embodiment of the method 110 may proceed substantially as follows. The method 110 may be a corollary to the functionality of the system 10 described above and shown in FIGS. 1 and 2, and may be similarly implemented using the various components of the system 10. An attempt may be made to start the electric motor 12, as shown in step 112, and a position of a rotor 16 may be determined, as shown in step 114. The determined position of the rotor 16 may be used to convert a torque demand on the electric motor 12 to the demanded D-axis current value, as shown in step 116. The demanded D-axis current value may be compared to a supplied D-axis current value in order to detect an abnormal start condition, as shown in step 118, and the electric motor 12 may be restarted if the demanded D-axis current value differs from the supplied D-axis current value by at least a pre-established threshold amount, as shown in step 120. In various implementations, the pre-established threshold amount for the D-axis current may be based on a percentage of the demanded D-axis current value, and may be approximately between ten percent and forty percent, or approximately between twenty percent and thirty percent. In one implementation, if the demanded D-axis current value does not differ from the supplied D-axis current value by at least the pre-established threshold amount, then a difference between a torque demand and an actual current may be used to drive a voltage applied to the electric motor 12, as shown in step 122.

The method may further include also implementing a sensorless technology to determine whether the electric motor 12 has started, as shown in step 124. The electric motor 12 may be restarted if the sensorless technology determines that the electric motor 12 failed to start, as shown in step 120. If the sensorless technology determines that the electric motor 12 started successfully, the ultimate determination of whether the electric motor 12 has started may be deferred to the current solution, as shown in step 126—i.e., if the demanded D-axis current differs from the supplied D-axis current by at least the pre-established threshold amount, then the electric motor 12 may be restarted even if the sensorless technology determines that the electric motor 12 successfully started.

The method 110 may include more, fewer, or alternative steps and/or involve more, fewer, or alternative components, including those discussed elsewhere herein, and particularly those discussed in the preceding section describing the system 10.

Figure 3:
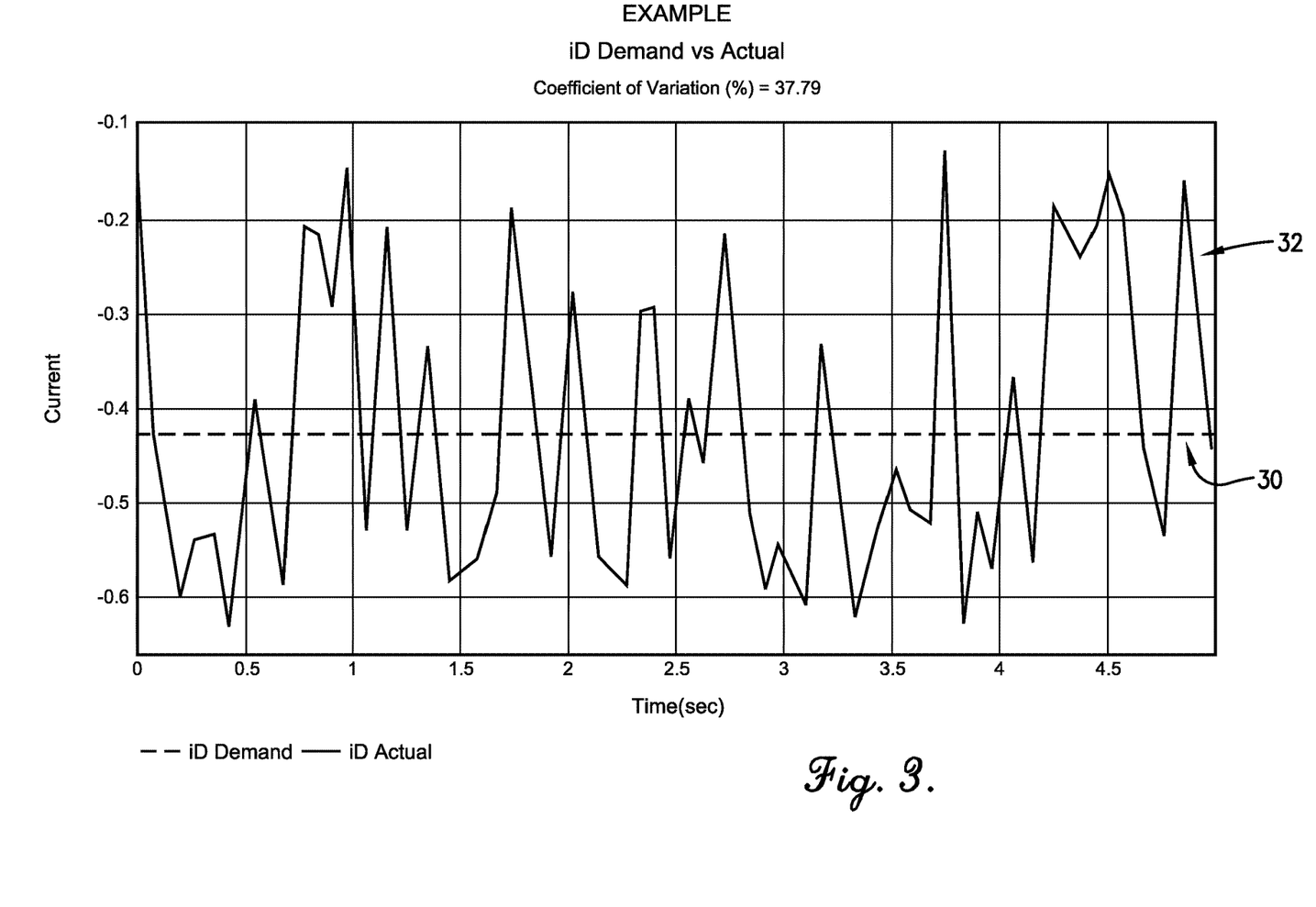
FIG. 3 is a graph of example demand and actual D-axis current over time.
Figure 4:
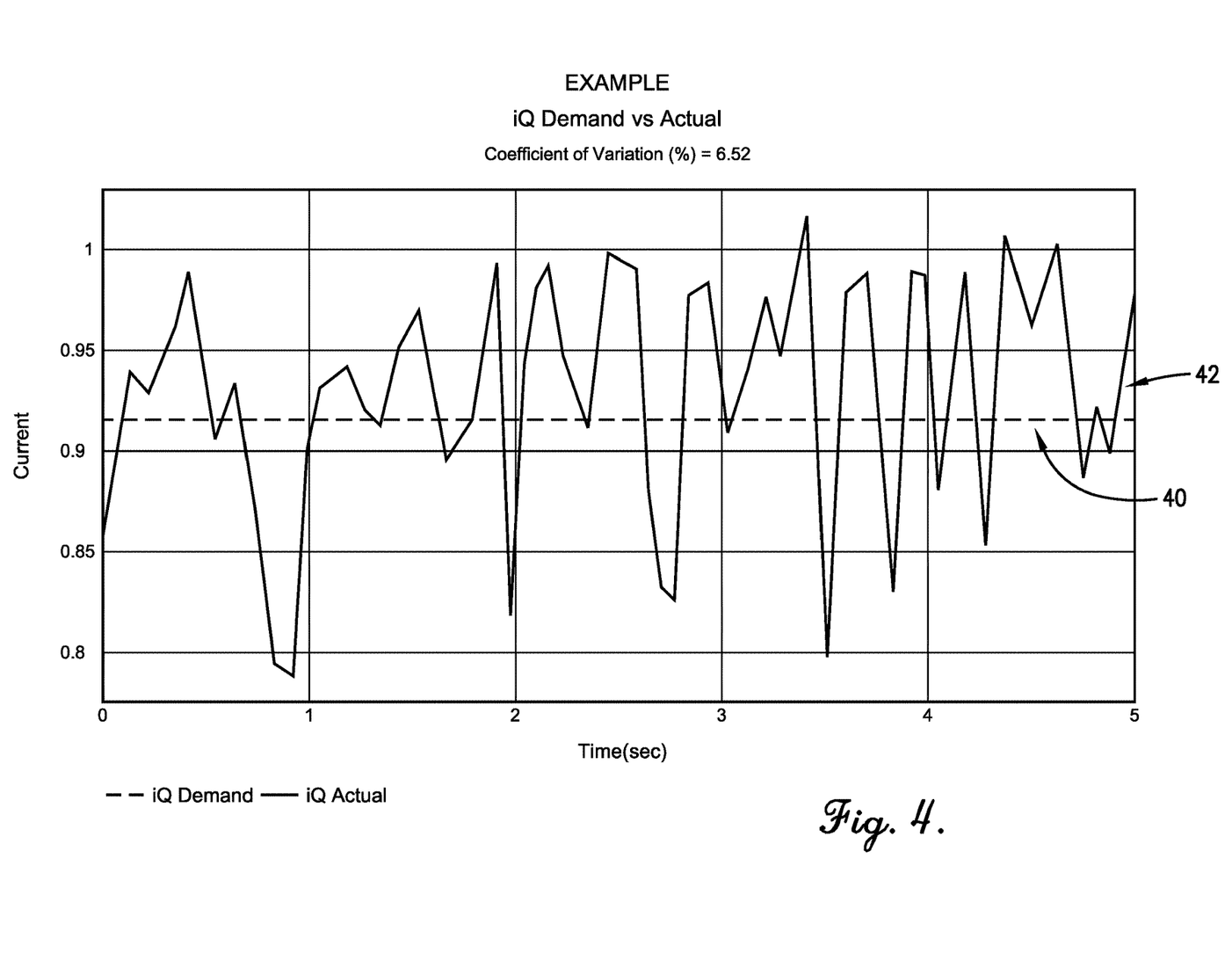
FIG. 4 is a graph of example demand and actual Q axis current over time.

Referring again to FIGS. 3 and 4, in a first example, an embodiment of the present invention was implemented in a one-third horsepower electric motor 12 with one-half horsepower control. The coefficient of variance between demand iD 30 and actual iD 32 with the same torque demand during a failure to start was 37.8%, while the variation during normal running was 12.6%. Variation on the D-axis, with a coefficient of variation of 37.8%, is shown in FIG. 3, and variation on the Q-axis, with a coefficient of variation of 6.52%, under the same loading condition is shown in FIG. 4. The coefficient of variance between demand iD and actual iD with a 1.0 N*m torque demand during a failure to start was 37.8%, while the difference with a 2.0 N*m torque demand during a failure to start was 35.6%. The coefficient of variance between demand iD and actual iD with a 0.25 N*m torque demand during normal running was 12.7%, while the difference with a 1.0 N*m torque demand during normal running was 12.6%. The maximum, minimum, and average variances of the D-axis current at a 8 kHz rate in the failure-to-start and normal running conditions were consistently distinct across different speeds and torque demands.

In a second example, an embodiment of the present invention was implemented in a one-third horsepower electric motor. The difference between demand iD and actual iD with the same torque demand during a failure to start was 33%, while the difference during normal running was 6%. The difference between demand iD and actual iD with a 1.0 N*m torque demand during a failure to start was 32%, while the difference with a 4.0 N*m torque demand during a failure to start was 35%. The difference between demand iD and actual iD with a 1 N*m torque demand during normal running was 7.2%, while the difference with a 4.0 N*m torque demand during normal running was 5.8%.

Although the invention has been described with reference to the one or more embodiments illustrated in the figures, it is understood that equivalents may be employed and substitutions made herein without departing from the scope of the invention as recited in the claims.

Having thus described one or more embodiments of the invention, what is claimed as new and desired to be protected by Letters Patent includes the following:

1. An electric motor system comprising:
   an electric motor including—
   a stator and a rotor, said rotor including a core and one or more permanent magnets positioned at least partially inside the core so as to produce an electrical reluctance when the rotor is moving relative to the stator; and
   a motor controller in electronic communication with the electric motor and configured to—
   detect an abnormal start condition by comparing a demanded D-axis current value to a supplied D-axis current value, and
   restart the electric motor when the demanded D-axis current value differs from the supplied D-axis current value by at least a pre-established threshold amount.

2. The electric motor system of claim 1, wherein the electric motor is a three-phase electric motor producing between one-quarter horsepower and five horsepower.

3. The electric motor system of claim 1, wherein the core includes one or more slots, and each permanent magnet of the one or more permanent magnets is received in a respective slot of the one or more slots.

4. The electric motor system of claim 1, wherein the pre-established threshold amount is between ten percent and forty percent.

5. The electric motor system of claim 1, wherein the pre-established threshold amount is between twenty percent and thirty percent.

6. The electric motor system of claim 1, wherein the motor controller is further configured to implement a sensorless technology for determining whether the electric motor has started.

7. The electric motor system of claim 6, wherein the motor controller restarts the electric motor when the demanded D-axis current value differs from the supplied D-axis current value by at least the pre-established threshold amount even when the sensorless technology determines that the electric motor has started.

8. The electric motor system of claim 1, wherein the motor controller is further configured to—
   determine a position of the rotor;
   use the determined position of the rotor to convert a torque demand on the electric motor to the demanded D-axis current value; and
   use a difference between a torque demand and an actual current to drive a voltage applied to the electric motor when the demanded D-axis current value does not differ from the supplied D-axis current value by at least the pre-established threshold amount.

9. An electric motor system comprising:
   a three-phase electric motor producing between one-quarter horsepower and five horsepower and including—
   a stator and a rotor, said rotor including a core presenting one or more slots, and said rotor including one or more permanent magnets with each permanent magnet received in a respective slot of the one or more slots and positioned at least partially inside the core so as to produce an electrical reluctance when the rotor is moving relative to the stator; and
   a motor controller in electronic communication with the electric motor and configured to—
   determine a position of the rotor,
   use the determined position of the rotor to convert a torque demand on the three-phase electric motor to a demanded D-axis current value,
   detect an abnormal start condition by comparing the demanded D-axis current value to a supplied D-axis current value,
   restart the three-phase electric motor when the demanded D-axis current value differs from the supplied D-axis current value by at least a pre-established threshold amount based on a percentage of the demanded D-axis current value, and use a difference between the torque demand and an actual current to drive a voltage applied to the three-phase electric motor when the demanded D-axis current value does not differ from the supplied D-axis current value by at least the pre-established threshold amount.

10. The electric motor system of claim 9, wherein the motor controller is further configured to implement a sensorless technology of determining whether the three-phase electric motor has started, and the motor controller restarts the three-phase electric motor when the demanded D-axis current value differs from the supplied D-axis current value by at least the pre-established threshold amount even when the sensorless technology determines that the three-phase electric motor has started.

11. An electric motor system comprising:
an electric motor including—
a stator and a rotor, said rotor including a core and one or more permanent magnets positioned at least partially inside the core so as to produce an electrical reluctance when the rotor is moving relative to the stator; and
a motor controller in electronic communication with the electric motor and configured to—
detect an abnormal start condition by comparing a demanded Q-axis current value to a supplied Q-axis current value, and
restart the electric motor when the demanded Q-axis current value differs from the supplied Q-axis current value by at least a pre-established threshold amount.

12. The electric motor system of claim 11, wherein the electric motor is a three-phase electric motor producing between one-quarter horsepower and five horsepower.

13. The electric motor system of claim 11, wherein the core includes one or more slots, and each permanent magnet of the one or more permanent magnets is received in a respective slot of the one or more slots.

14. The electric motor system of claim 11, wherein the pre-established threshold amount is between two percent and twelve percent.

15. The electric motor system of claim 11, wherein the pre-established threshold amount is between four percent and ten percent.

16. The electric motor system of claim 11, wherein the motor controller is further configured to implement a sensorless technology for determining whether the electric motor has started.

17. The electric motor system of claim 16, wherein the motor controller restarts the electric motor when the demanded Q-axis current value differs from the supplied Q-axis current value by at least the pre-established threshold amount even when the sensorless technology determines that the electric motor has started.

18. The electric motor system of claim 11, wherein the motor controller is further configured to—
determine a position of the rotor;
use the determined position of the rotor to convert a torque demand on the electric motor to the demanded Q-axis current value; and
use a difference between a torque demand and an actual current to drive a voltage applied to the electric motor when the demanded Q-axis current value does not differ from the supplied Q-axis current value by at least the pre-established threshold amount.

* * * * *